United States Patent [19]
Huang et al.

[11] Patent Number: 5,625,225
[45] Date of Patent: Apr. 29, 1997

[54] MULTI-LAYERED, INTEGRATED CIRCUIT PACKAGE HAVING REDUCED PARASITIC NOISE CHARACTERISTICS

[75] Inventors: Chin-Ching Huang, San Jose; Sang S. Lee, Sunnyvale; Ramachandra A. Rao, Pleasanton; Fernand N. Forcier, Jr., San Jose, all of Calif.

[73] Assignee: VLSI Technology, Inc., San Jose, Calif.

[21] Appl. No.: 589,751

[22] Filed: Jan. 22, 1996

Related U.S. Application Data

[63] Continuation of Ser. No. 172,502, Dec. 22, 1993, abandoned.

[51] Int. Cl.$^6$ .................................................. H01L 23/053
[52] U.S. Cl. ........................... 257/700; 257/773; 257/691; 361/820
[58] Field of Search .................................. 257/700, 773, 257/690, 691, 698; 361/777, 794, 826

[56] References Cited

U.S. PATENT DOCUMENTS

| | | | |
|---|---|---|---|
| 4,675,789 | 6/1987 | Kuwabara et al. | 361/414 |
| 4,884,170 | 11/1989 | Ohki et al. | 361/414 |
| 4,972,253 | 11/1990 | Palino et al. | 257/691 |
| 5,363,280 | 11/1994 | Chobot et al. | 361/794 |
| 5,365,091 | 11/1994 | Yamagishi | 257/203 |
| 5,365,406 | 11/1994 | Kurashima | 361/777 |

FOREIGN PATENT DOCUMENTS 4184962  7/1992  Japan .

OTHER PUBLICATIONS

"Low Inductance Multilayer Ceramic Module", IBM Tech. Disc. Bulletin, vol. 32, No. 10B; pp. 256–258, Mar., 1990.

*Primary Examiner*—Jerome Jackson, Jr.
*Assistant Examiner*—Nathan K. Kelley
*Attorney, Agent, or Firm*—Majestic, Parson, Siebert & Hsue

[57] ABSTRACT

A multi-layered, high performance integrated circuit package is disclosed having a number of design features which increase the performance and manufacturability of the integrated circuit package, and reduce the effects of parasitic noise generated within the package. The metallic layers connecting contact fingers formed on ledges around the periphery of a die cavity area, to their respective package pins are organized such that a ground metallic layer is interposed between each pair of input/output signal metallic layers, and each input/output signal metallic layer is sandwiched between a pair of metallic layers wherein one layer of the pair is connected to a voltage supply and the other layer of the pair is connected to a corresponding ground reference. On one of the ledges, contact fingers corresponding to a first set of input/output signals are evenly dispersed around contact fingers corresponding to the ground reference, and on another one of the ledges, contact fingers corresponding to a second set of input/output signals are evenly dispersed around contact fingers corresponding to the voltage supply. On a bottom surface of the integrated circuit package a plurality of pins are arranged in a pin-grid-array, and pins corresponding to the voltage supply and ground reference are placed in the four outer corners of the bottom surface, so as to minimize parasitic noise generated on the voltage and ground lines connected to these pins, by active circuitry of the packaged integrated circuit.

2 Claims, 11 Drawing Sheets

PRIOR ART

INTERCONNECTIONS OF PADS TO PINS

| PAD # | PIN # | PAD # | PIN # | PAD # | PIN # | PAD # | PIN # | PAD # | PIN # |
|---|---|---|---|---|---|---|---|---|---|
| 1 | D4 | 41 | B14 | 81 | L15 | 121 | V12 | 161 | M4 |
| 2 | C4 | 42 | C14 | 82 | M18 | 122 | U11 | 162 | N2 |
| 3 | B3 | 43 | D13 | 83 | M16 | 123 | V11 | 163 | H3 |
| 4 | A3 | 44 | A15 | 84 | M17 | 124 | T9 | 164 | N1 |
| 5 | D5 | 45 | B15 | 85 | M15 | 125 | U10 | 165 | L4 |
| 6 | C4 | 46 | D14 | 86 | N18 | 126 | R9 | 166 | M2 |
| 7 | B4 | 47 | C15 | 87 | N16 | 127 | U9 | 167 | L3 |
| 8 | A4 | 48 | A16 | 88 | N17 | 128 | T8 | 168 | M1 |
| 9 | C5 | 49 | B16 | 89 | N15 | 129 | U8 | 169 | K4 |
| 10 | D6 | 50 | D15 | 90 | P18 | 130 | R8 | 170 | L2 |
| 11 | B5 | 51 | C16 | 91 | P17 | 131 | V7 | 171 | K3 |
| 12 | C6 | 52 | C17 | 92 | P16 | 132 | T7 | 172 | L1 |
| 13 | A5 | 53 | C18 | 93 | R18 | 133 | U7 | 173 | K2 |
| 14 | D7 | 54 | E15 | 94 | R17 | 134 | R7 | 174 | J2 |
| 15 | B6 | 55 | D16 | 95 | P15 | 135 | V6 | 175 | J3 |
| 16 | C7 | 56 | D17 | 96 | R16 | 136 | T6 | 176 | H2 |
| 17 | A6 | 57 | D18 | 97 | T18 | 137 | U6 | 177 | J4 |
| 18 | D8 | 58 | F15 | 98 | T17 | 138 | R6 | 178 | G1 |
| 19 | B7 | 59 | F16 | 99 | R15 | 139 | V5 | 179 | H3 |
| 20 | C8 | 60 | C16 | 100 | T16 | 140 | U5 | 180 | G2 |
| 21 | A7 | 61 | G15 | 101 | U16 | 141 | T5 | 181 | H4 |
| 22 | D9 | 62 | E17 | 102 | V16 | 142 | V4 | 182 | F1 |
| 23 | D8 | 63 | G16 | 103 | R14 | 143 | U4 | 183 | G3 |
| 24 | C9 | 64 | E18 | 104 | T15 | 144 | T4 | 184 | F2 |
| 25 | B9 | 65 | H15 | 105 | U15 | 145 | R5 | 185 | G4 |
| 26 | B10 | 66 | F17 | 106 | V15 | 146 | V3 | 186 | E1 |
| 27 | A11 | 67 | H16 | 107 | R13 | 147 | U3 | 187 | F3 |
| 28 | C10 | 68 | F18 | 108 | T13 | 148 | R4 | 188 | E2 |
| 29 | B11 | 69 | J15 | 109 | T14 | 149 | T3 | 189 | E3 |
| 30 | D10 | 70 | G17 | 110 | R12 | 150 | T2 | 190 | F4 |
| 31 | A12 | 71 | J16 | 111 | U14 | 151 | T1 | 191 | D1 |
| 32 | C11 | 72 | G18 | 112 | T12 | 152 | P4 | 192 | D2 |
| 33 | B12 | 73 | H17 | 113 | V14 | 153 | R3 | 193 | D3 |
| 34 | D11 | 74 | H18 | 114 | R11 | 154 | R2 | 194 | E4 |
| 35 | A13 | 75 | K16 | 115 | U13 | 155 | R1 | 195 | C1 |
| 36 | C12 | 76 | J17 | 116 | T11 | 156 | P3 | 196 | C2 |
| 37 | B13 | 77 | K15 | 117 | V13 | 157 | N4 | | |
| 38 | D12 | 78 | K17 | 118 | R10 | 158 | P2 | | |
| 39 | A14 | 79 | L16 | 119 | U12 | 159 | N3 | | |
| 40 | C13 | 80 | L17 | 120 | T10 | 160 | P1 | | |

FIG. 13.

MULTI-LAYERED, INTEGRATED CIRCUIT PACKAGE HAVING REDUCED PARASITIC NOISE CHARACTERISTICS

This is a continuation of application Ser. No. 08/172,502, filed Dec. 22, 1993, now abandoned.

BACKGROUND OF THE INVENTION

This invention relates in general to integrated circuit ("IC") packages and in particular, to high performance IC packages.

Ongoing design goals for integrated circuits include increasing their density, functionality, and speed. To achieve these goals, new design tools, process equipment, and test equipment continue to be developed. As a result, the performance and in particular, the density, functionality, and speed of integrated circuits continues to increase dramatically.

Such advances in integrated circuit performance, however, may be wasted unless parallel developments in packaging technology occur. In particular, as the density and functionality of integrated circuits increase, the density and number of package pins required for the integrated circuit to communicate with other electronic devices increases, and as the speed of the signals being communicated through those increased number of package pins increases, parasitic noise generated from various electrical paths connecting the integrated circuit to the increased number of package pins also increases, and such increased noise may result in spurious logic errors.

FIGS. 1–4 illustrate, as an example, various views of a conventional plastic pin grid array ("PPGA") package 10. The PPGA package 10 includes a plastic package body 11 having a cavity area 14 housing an integrated circuit 13. The integrated circuit 13 is electrically connected to an array of pins 12 extending out of a bottom surface 21 of the package body 11, by bonding wires 15 which connect bond pads 17 formed on the integrated circuit 13 to respective contact fingers 18 formed upon first and second ledge areas, 19 and 20, which in turn, connect through metallic layers 22 to their respective pins 12. A ceramic lid 22 is attached to the bottom surface 21 of the package body 11 to protect and encase the integrated circuit 13 within the cavity area 14.

OBJECTS AND SUMMARY OF THE INVENTION

Figure 1:
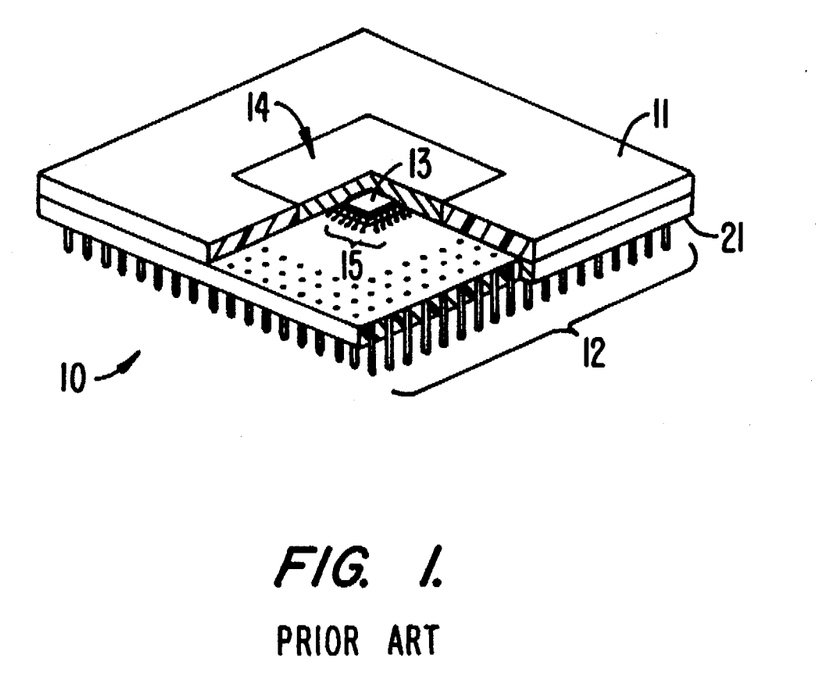
FIGS. 1–4 illustrate, as examples, a perspective, a partial cross-sectional, a partial bottom plan view without a lid attached over a die cavity area, and a bottom plan view with the lid attached over the die cavity area, respectively, of a conventional plastic pin grid array package ("PPGA")
Figure 2:
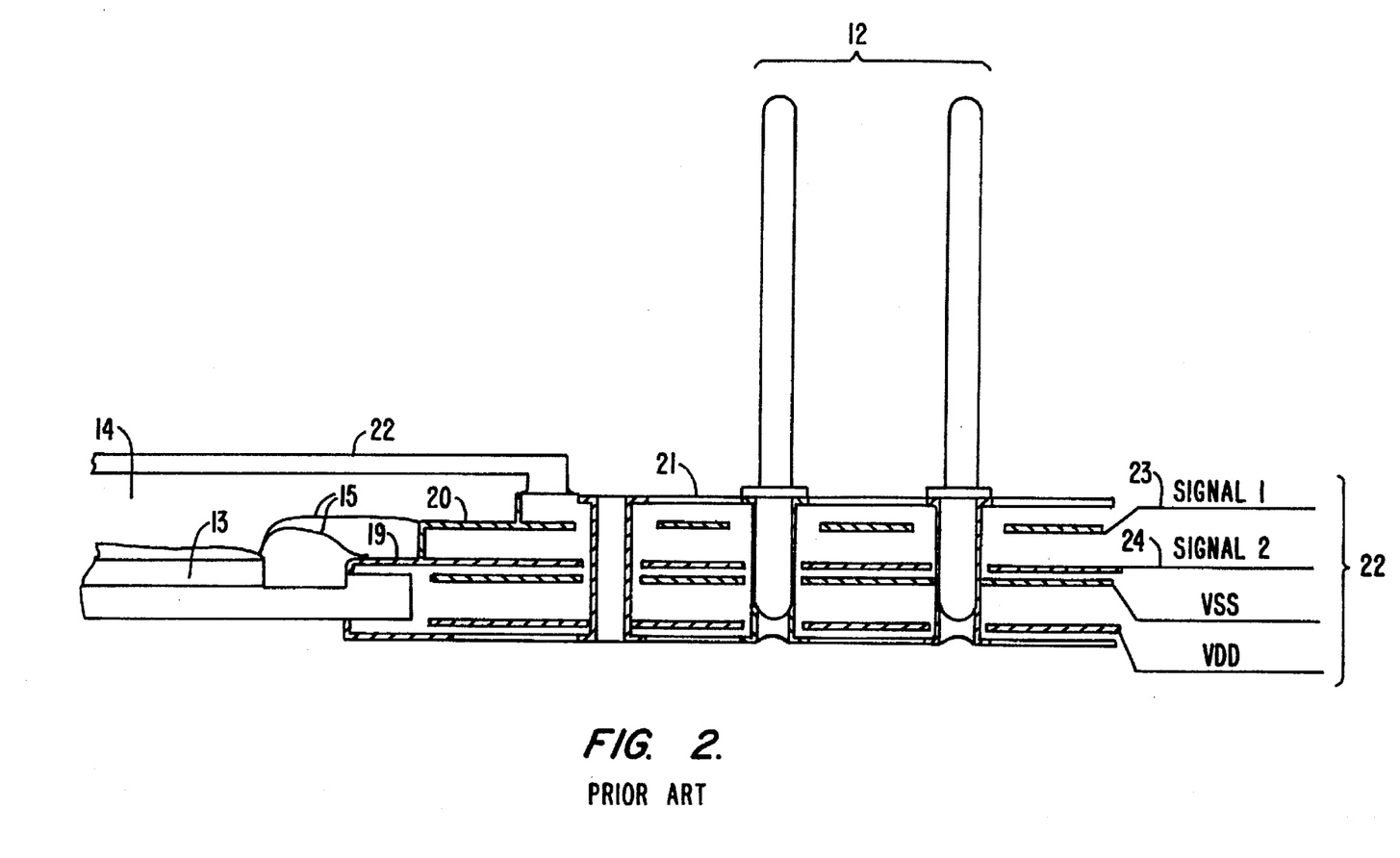
Figure 3:
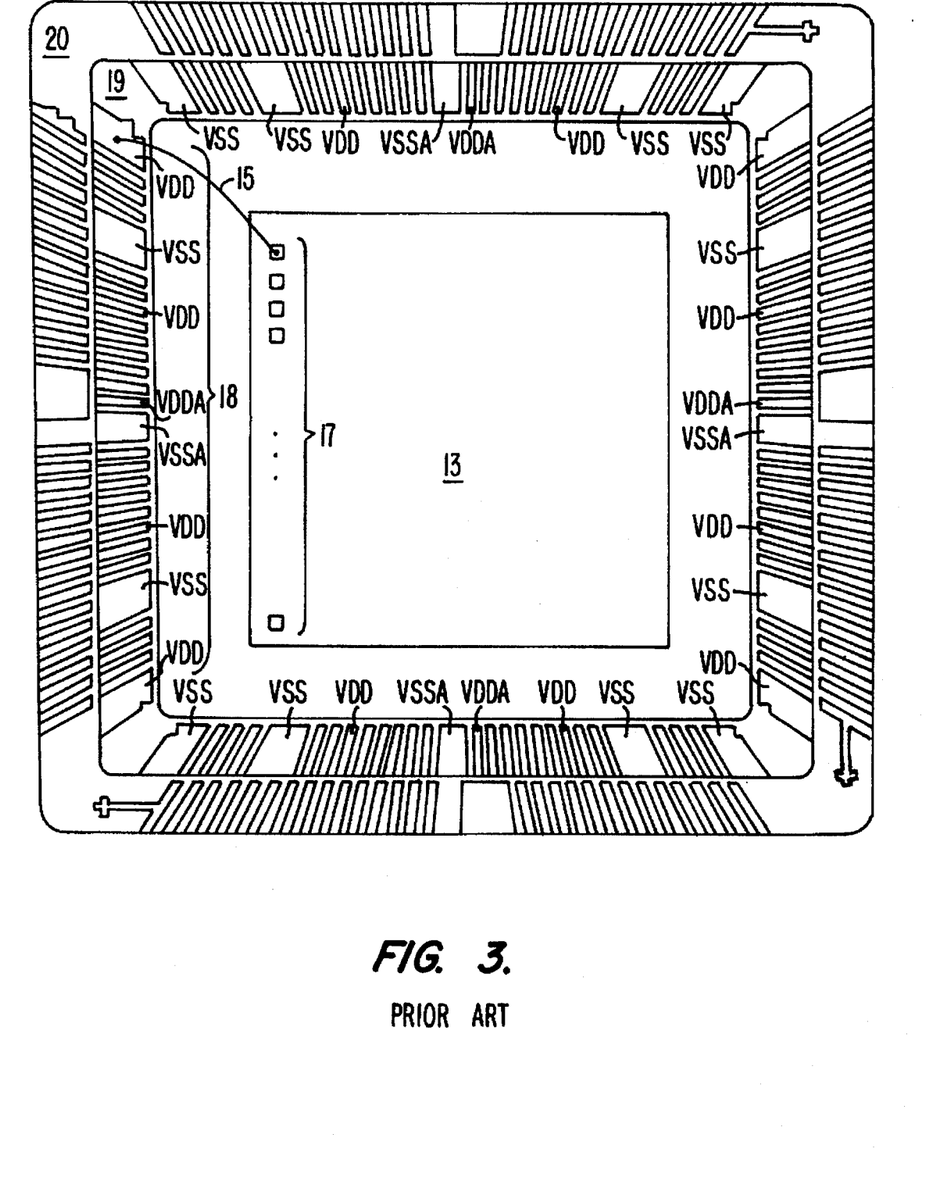

The following aspects of the present invention are based upon the identification of a number of parasitic noise sources in conventional high performance integrated circuit packages, such as that illustrated in FIGS. 1–4, for example, wherein briefly stated, one such identified source of noise is crosstalk between multiple layers of signal traces (e.g., 23 and 24 in FIG. 2). Uneven current distributions between the pins (e.g., 12) is also identified as another source of noise that is generated when the various signals to the various pins simultaneously switch between logic levels. Still another source of identified noise is induced voltages on the voltage supply and ground lines, which can cause, for example, such phenomena as "ground bounce."

Accordingly, one object of the present invention is to reduce the noise generated in a multi-layered, integrated circuit package by reducing the effects of crosstalk between two or more layers of signal traces.

Another object of the present invention is to reduce the noise generated in a high performance integrated circuit package by balancing out the impedance paths formed between the integrated circuit and each of the pins of the integrated circuit package.

Another object of the present invention is to reduce the noise generated in a high performance integrated circuit package by reducing the effects of induced voltages along the voltage supply and ground lines.

Still another general object of the present invention is to increase both the performance and manufacturability of high performance integrated circuit packages.

These and additional objects are accomplished by the various aspects of the present invention, wherein briefly stated, one aspect of the present invention accomplishes one or more of these objects by a multi-layered, integrated circuit package structure comprising a plurality of metallic layers formed within the package structure, wherein a metallic layer connected to ground is interposed between first and second metallic layers connected to first and second sets of input/output signals, respectively, so as to inhibit crosstalk between the first and second metallization layers.

In another aspect of the present invention, a multi-layered, integrated circuit package structure comprises a plurality of metallic layers formed within the package structure, wherein a metallic layer connected to input/output signals is sandwiched between a corresponding pair of metallic layers, one of the pair being connected to a voltage supply and the other of the pair being connected to ground, so that the voltage supply and ground metallic layers sandwiching the input/output signal metallic layer inhibit electromagnetic radiation emanating from the input/output signal metallic layer from inducing noise on other circuitry or signal lines within close proximity to the input/output signal metallic layer.

In another aspect of the present invention, a multi-layered package structure encases an integrated circuit having a plurality of core transistors for performing a logic function of the integrated circuit, and a plurality of input/output transistors for controlling input/output signals to and from the plurality of core transistors. The integrated circuit also has a plurality of voltage supply bond pads and a plurality of ground bond pads associated with the plurality of core transistors, and a separate plurality of voltage supply bond pads and plurality of ground pads associated with the plurality of input/output transistors. The package structure comprises a plurality of metallization layers including first, second, third, and fourth metallization layers formed on separate planes substantially parallel to one another. The first metallization layer is connected to the plurality of voltage supply bond pads associated with the plurality of input/output transistors, the second metallization layer is connected to the plurality of ground bond pads associated with the plurality of input/output transistors, the third metallization layer is connected to the plurality of voltage supply bond pads associated with the plurality of core transistors, and the fourth metallization layer is connected to the plurality of ground bond pads associated with the plurality of core transistors.

In another aspect of the present invention, a high performance integrated circuit package structure comprises a two-tiered ledge structure formed around a periphery of a die cavity area, wherein a plurality of contact fingers are formed on both a top tier of the two-tiered structure, and a bottom tier of the two-tiered structure. Included among the plurality of contact fingers formed on the top tier of the two-tiered structure are a plurality of ground contact fingers evenly interspersed among a first plurality of input/output signal contact fingers, and included among the plurality of contact fingers formed on the bottom tier of the two-tiered structure are a plurality of voltage supply contact fingers evenly interspersed among a second plurality of input/output signal contact fingers, so as to optimize the current distribution flowing through the first and second plurality of input/output signal contact fingers.

In still another aspect of the present invention, a high performance integrated circuit package structure comprises a plurality of pins extending out of a bottom surface of the package structure, wherein associated voltage supply and ground pins are positioned on the bottom surface such that they are substantially the same distance away from a center of an integrated circuit encased in the integrated circuit package structure. In the preferred embodiment of the present invention, voltage supply and ground pins corresponding to input/output transistors are formed in the four outer corners of the bottom surface, and voltage supply and ground pins corresponding to core transistors are formed in four areas, each mid-way between adjacent corners of the four corners.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 5:
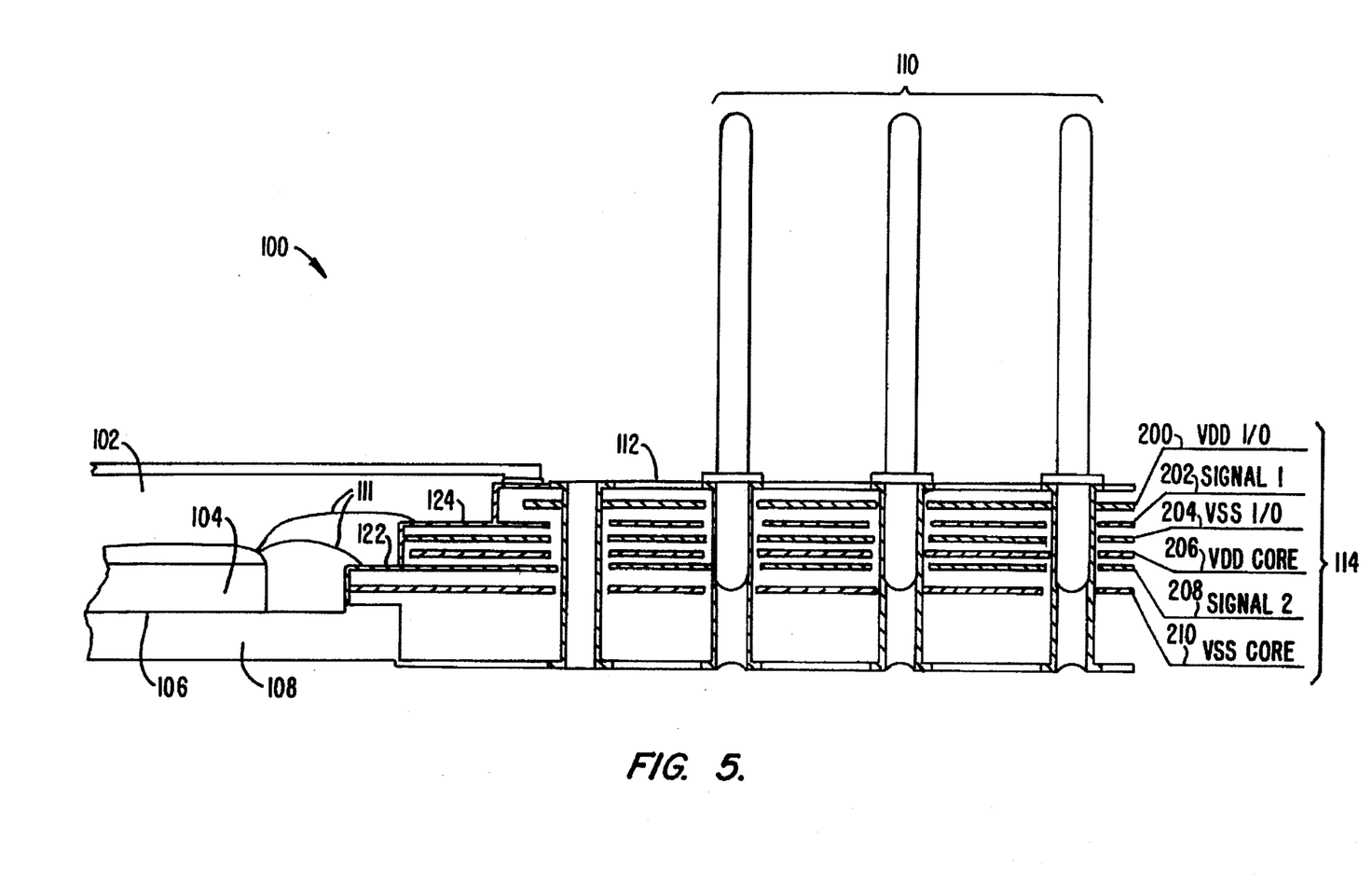
FIG. 5 illustrates, as an example, a partial cross-sectional view, including a partial die cavity area, two-tiered ledge area, plurality of pins, and plurality of metallization layers useful in connecting an integrated circuit die housed in the die cavity area to the pins, of a PPGA package utilizing aspects of the present invention.

FIG. 5 illustrates, as an example, a partial, cross-sectional view of a multi-layer, integrated circuit package 100 utilizing aspects of the present invention. The integrated circuit package 100 houses in a die cavity area 102, an integrated circuit die 104 which is attached, using a silver filled epoxy 106, to a copper plug 108, which acts as both a mechanical support and a heat sink for the integrated circuit die 104.

The integrated circuit die 104 communicates with other electronic devices through package pins 110 which extend out of a bottom surface 112 of the integrated circuit package 100. The integrated circuit die 104 is electrically connected to the package pins 110 primarily through gold wire bonds 111 and metallization layers 114. Each of the gold wire bonds 111 is attached at one end to one of a plurality of bond pads 116 (FIG. 11) formed on the integrated circuit die 104, and at another end to a respective one of a plurality of contact fingers, 118 and 120 (FIG. 11), formed on first and second ledges, 122 and 124, respectively, of a two-tiered ledge area adjacent to the die cavity area 102 of the integrated circuit package 100.

Figure 6:
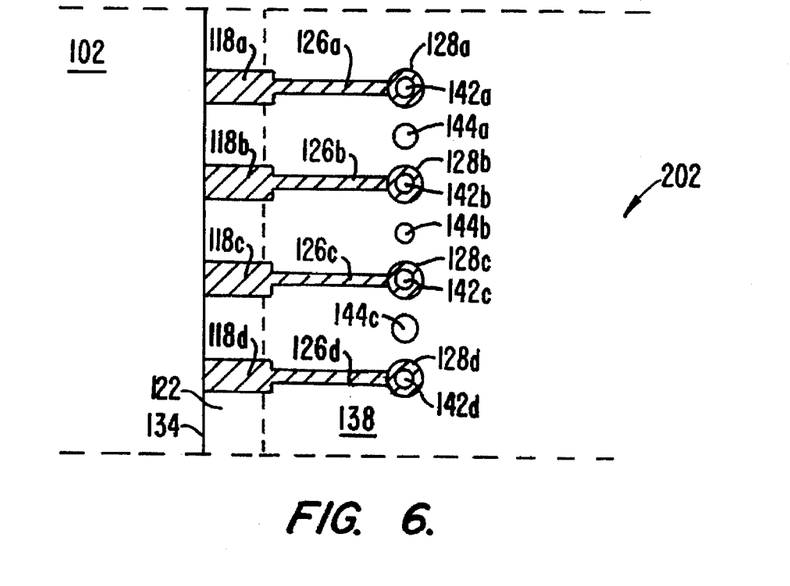
FIGS. 6–7 illustrate, as examples, partial cross-sectional views of the PPGA package utilizing aspects of the present invention, showing respectively, first and second signal metallization layers.
Figure 7:
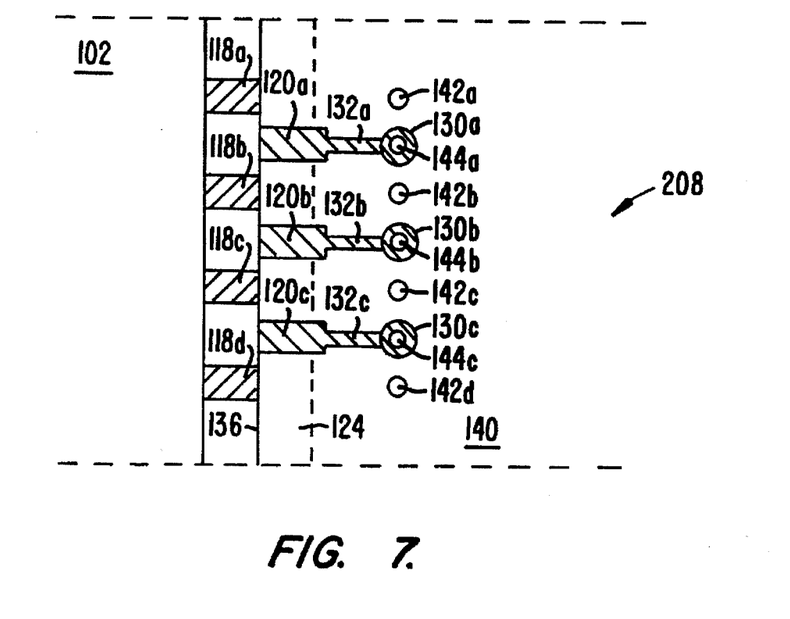

Each of the plurality of contact fingers, 118 and 120 (FIG. 11), are in turn, connected to a respective one of the package pins 110 through a respective conductive trace formed on one of the metallization layers 114. FIGS. 6 and 7 illustrate simplified, partial cross-sectional views of the PPGA package utilizing aspects of the present invention, which respectively show first and second input/output signal metallization layers, 202 and 208, formed on insulative layers, 138 and 140, respectively. In particular, FIG. 6 illustrates four contact fingers 118a–118d of the plurality of contact fingers 118 formed on the exposed ledge area 122 of the insulative layer 138, and FIG. 7 illustrates three contact fingers 120a–120c of the plurality of contact fingers 120 formed on the exposed ledge area 124 of the insulative layer 140.

As shown in FIGS. 6 and 7, contact rings 128a–128d are respectively formed around plated-through holes 142a–142d, and contact rings 130a–130c, are respectively formed around plated-through holes 144a–144c. Each of the plated-through holes, e.g., 142a–142d and 144a–144c, holds a respective one of the package pins 110, and each of the contact rings, e.g., 128a–128d and 130a–130c, makes electrical contact with a pin being held by its respective plated-through hole. Thereupon, electrical connections between the contact fingers 118a–118d and their respective package pins are made through respective conductive traces 126a–126d which connect to respective contact rings 128a–128d, and electrical connection between the contact fingers 120a–120c and their respective pins are made through respective conductive traces 132a–132c which connect to respective contact rings 130a–130c. In the preferred embodiment of the present invention, contact fingers 118a–118d, conductive traces 126a–126d, and contact rings 128a–128d are concurrently formed together as metallization layer 202 on insulative layer 138, and contact fingers 120a–120c, conductive traces 132a–132c, and contact rings 130a–130c are concurrently formed together as metallization layer 208 on insulative layer 140, using conventional metallization techniques.

Figure 8:
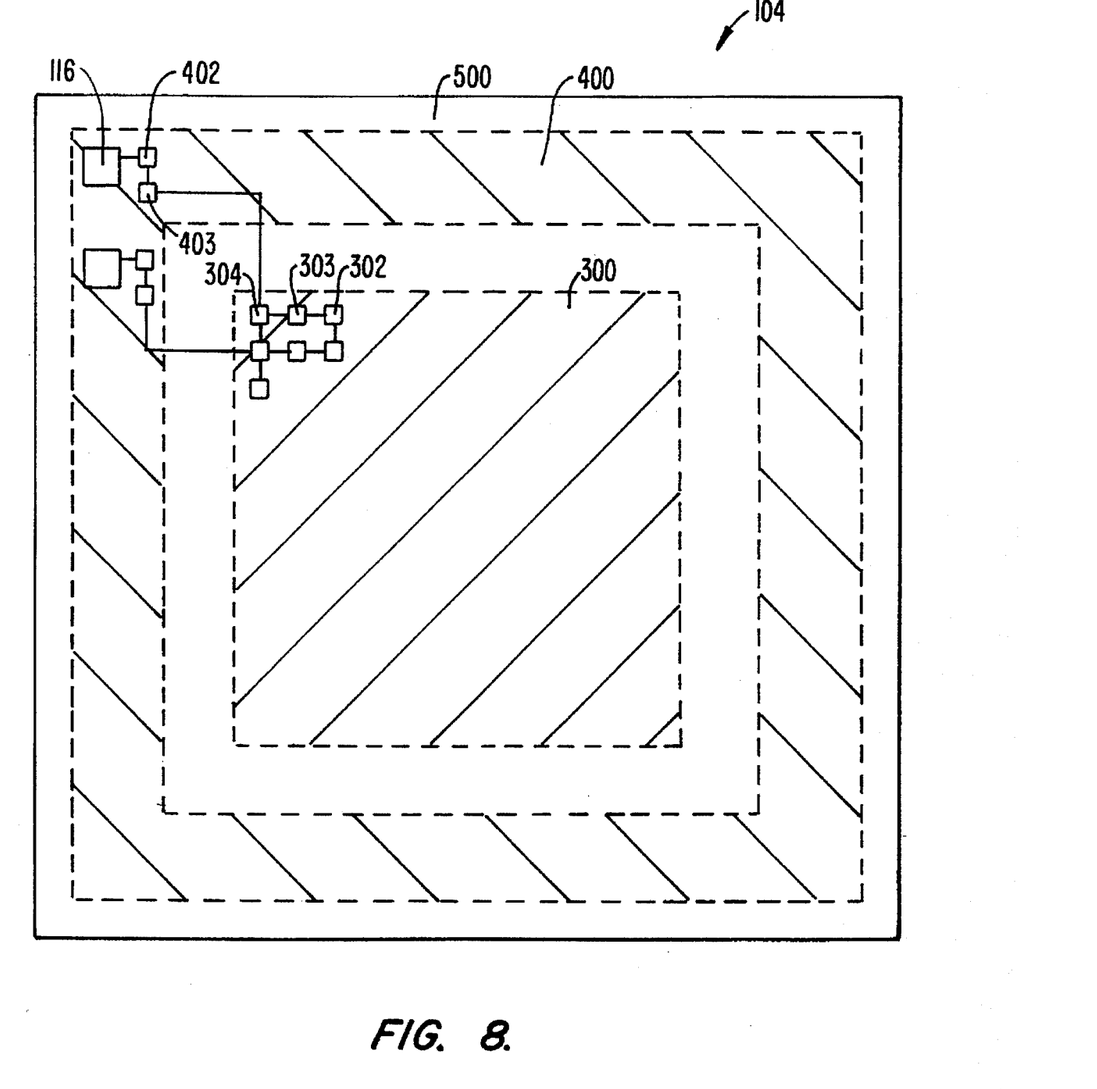
FIG. 8 illustrates, as an example, a simplified partial top plan view of an integrated circuit die.

Referring now to FIG. 8, a simplified example of a partial top plan view of the integrated circuit die 104 is illustrated. The integrated circuit die 104 has a top surface 500 having a core area 300 and an input/output area 400. Formed in the core area 300 are a plurality of transistors (e.g., 302–304) which perform the basic logic functions of the integrated circuit die 104. Formed in the input/output area 400 are a plurality of bond pads 116, and a plurality of input/output transistors (e.g., 402–403) which control the transmission and reception of input/output signals from and to the core transistors (e.g., 302–304), and to and from respective bond pads 116 on the integrated circuit die 104. The connection of the bond pads 116 to their respective package pins has already been described.

Voltage supply and ground inputs (e.g., VDD CORE and VSS CORE) provided to the core transistors (e.g., 302–304) are separated from voltage supply and ground inputs (e.g., VDD I/O and VSS I/O) provided to the input/output transistors (e.g., 402–403). In particular, referring back now to FIG. 5, the separated voltage supply and ground inputs (e.g., VDD CORE, VDD I/O, VSS CORE, and VSS I/O) are connected through selected ones of the package pins 110 to respective contact fingers and thence, to respective bond pads on the integrated circuit die 104, through separate metallization layers (e.g., 206, 200, 210, and 204, respectively). One reason for such separation is to reduce the noise level on the voltage supply and ground lines to the core transistors (e.g., 302–304). Another reason for such separation is to allow the core and input/output transistors to operate from different supply voltages. For example, in the preferred embodiment of the invention, the core transistors (e.g., 302–304) operate from a 3.0 volt supply to save power, and the input/output transistors (e.g., 402–403) operate from a 5.0 volt supply to enhance their switching speeds.

The ordering of the metallization layers 114 is selected such that parasitic noise generated, for example, by crosstalk between signal metallization layers, is minimized. For example, the input/output ground metallization layer 204 (e.g., VSS I/O) is interposed between the two input/output signal metallization layers, 202 and 208, to inhibit crosstalk between the two metallization layers, 202 and 208. Additionally, each signal metallization layer is sandwiched in between a voltage supply and ground pair to further inhibit induced noise being generated in other parts of the circuitry due to simultaneous switching of the input/output transistors connected to respective conductive traces in that metallization layer. For example, the first signal metallization layer 202 is sandwiched in between input/output voltage supply (e.g., VDD I/O) and input/output ground (e.g., VSS I/O) metallization layers, 200 and 204, respectively, and the second signal metallization layer 208 is sandwiched in between core voltage supply (e.g., VDD CORE) and core ground (e.g., VSS CORE) metallization layers, 206 and 210, respectively.

Since the voltage supply and ground metallization layers, 200, 204, 206, and 210, are on separate planes (i.e., layers) than their respective contact fingers, conventional contact holes or vias may be formed through the insulating layers, 138 and 140, where appropriate, to connect the voltage supply and ground metallization layers, 200, 204, 206, and 210, to their respective contact fingers. To reduce the number of contact holes or vias, however, and thus increase the manufacturability of the integrated circuit package 100, an alternative technique is employed for at least the ground metallization layers, 204 and 210.

Figure 9:
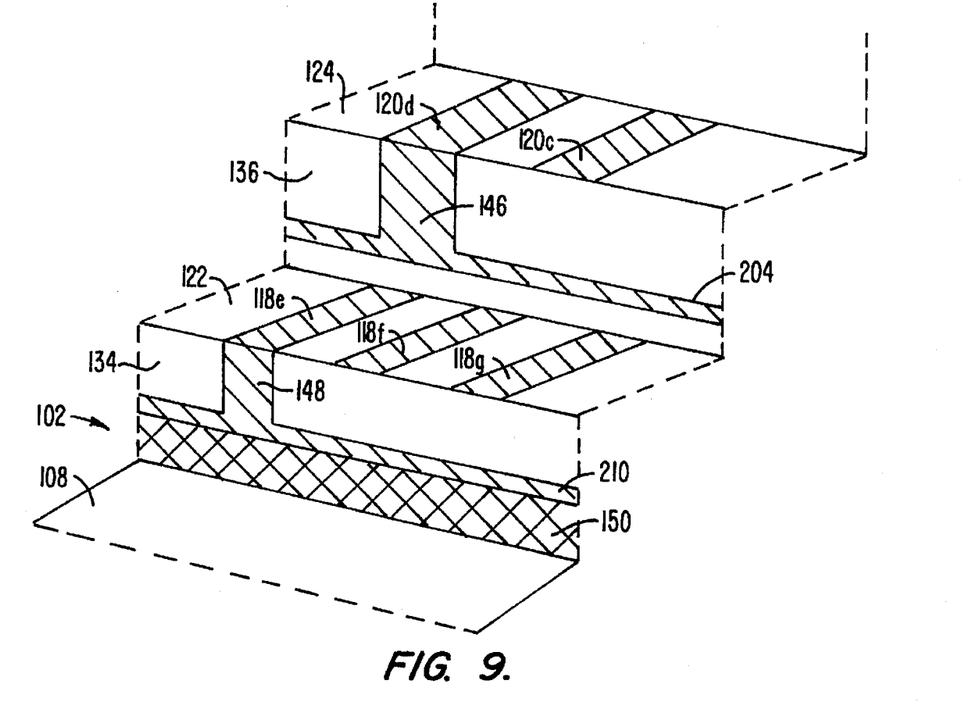
FIG. 9 illustrates, as an example, a simplified partial perspective view of a die cavity area and a two-tiered ledge area adjacent to the die cavity area.

FIG. 9 illustrates, as an example, a simplified partial perspective view of the cavity area 102 including the copper slug 108, and the two-tiered ledge area including ledges 122 and 124. In the figure, a VSS I/O contact finger 120d connects to the VSS I/O ground metallization layer 204 through a conductive trace 146 formed on the exterior wall 136 of the second ledge area 124, and VSS CORE contact finger 118e connects to the VSS CORE ground metallization layer 210 through a conductive trace 148 formed on the exterior wall 134 of the first ledge area 122. By forming such conductive traces, 146 and 148, over the exterior ledge walls, 136 and 134, respectively, the necessity to form contact holes or vias to accomplish the same result is eliminated. In addition, in the preferred embodiment of the invention, another conductive trace 150 is formed on the exterior wall 134 of the first ledge area 122, which extends from the VSS CORE ground metallization layer 210 directly to the copper slug 108. By making this connection on the exterior wall 134 instead of through the interior of the insulating layer 138, this contact area of the VSS CORE ground line is further isolated from the noisy conductive traces (e.g., 126a–126d and 132a–132c) and consequently, also serves to reduce the parasitic noise induced upon the VSS CORE ground line by these conductive traces (e.g., 126a–126d and 132a–132c).

Figure 10:
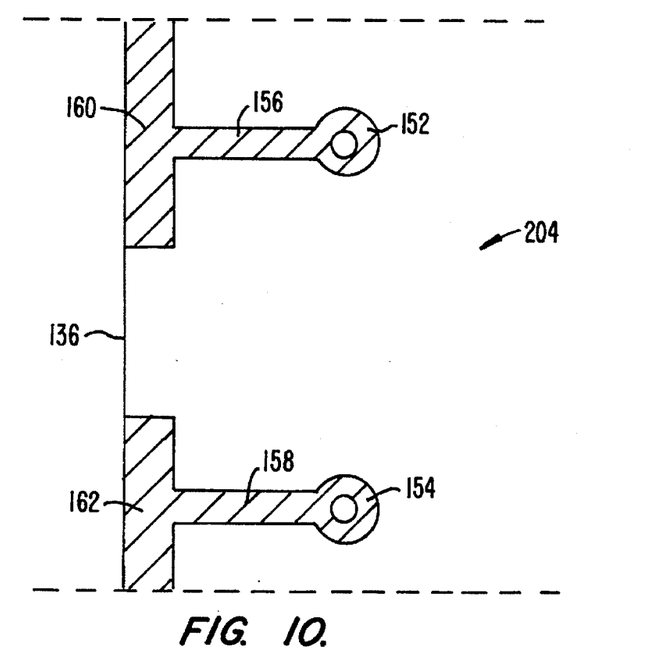
FIG. 10 illustrates, as an example, a partial cross-sectional view of the PPGA package utilizing aspects of the present invention, showing a ground metallization layer.

FIG. 10 illustrates, as an example, a simplified, partial cross-sectional view of the PPGA package utilizing aspects of the present invention, which shows the VSS I/O metallization layer 204 formed on a plane (i.e., layer) between the ledge areas 122 and 124 formed on insulative layers 138 and 140, respectively. To allow more than one VSS I/O contact finger (e.g., 120d) to be connected to one pin, a wide contact area 160 extending to the exterior wall 136 and connecting, through conductive trace 156, to contact ring 152 which holds the one pin, can be provided. A similar set of VSS I/O contact fingers can also be connected to another pin through a similar contact area 162 extending to the exterior wall 136 and connecting, through conductive trace 158, to contact ring 154 which holds the other pin. Although it is possible to connect contact areas 160 and 162 together, isolation of these areas, as illustrated, further serves to reduce parasitic noise generated on these lines through induction from the input/output signals and other noise generating sources. VSS CORE, VDD I/O, and VDD CORE metallization layers 210, 200, and 206, respectively, may be similarly formed.

Figure 11:
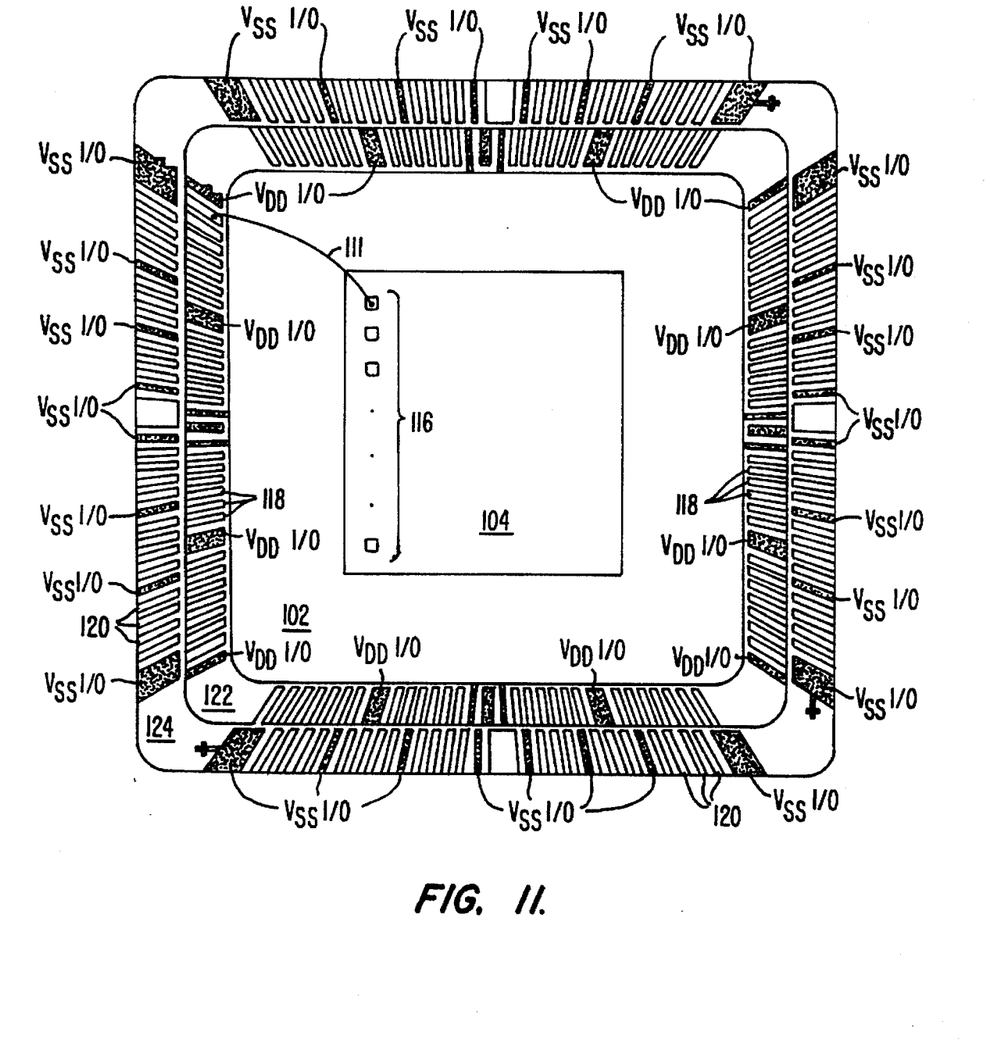
FIG. 11 illustrates, as an example, a partially formed, bottom plan view, including a die cavity area, a two-tiered ledge area around a periphery of the die cavity area, and a plurality of contact fingers on each tier of the ledge area of a PPGA package utilizing aspects of the present invention.

FIG. 11 illustrates, as an example, a partially formed, bottom plan view, including a die cavity area 102, a two-tiered ledge area formed around a periphery of the die cavity area 102, and a plurality of contact fingers, 118 and 120, on each tier, 122 and 124, respectively, of the ledge area of a PPGA package 100 utilizing aspects of the present invention. On the second ledge area 124 (i.e., second tier), a plurality of input/output signal contact fingers are shown as being evenly interspersed among a plurality of VSS I/O contact fingers. In particular, the number of input/output signal contact fingers formed between adjacent VSS I/O contact fingers is shown to be either 3 or 4 contact fingers. By thus both evenly interspersing the input/output signal contact fingers among the VSS I/O contact fingers, and limiting the number of signal contact fingers to less than 5 contact fingers between adjacent VSS I/O contact fingers, parasitic noise induced by crosstalk, for example, can be reduced between input/output signal contact fingers, and the current distribution to the input/output signal package pins can be shown to be more evenly distributed. By evenly distributing the current to the input/output signal package pins, it can further be shown that induced noise generated by the simultaneous switching on the various input/output signal lines can be reduced, thus reducing what is commonly referred to as "ground bounce" (i.e., a moving ground reference line).

Also, on the first ledge area 122 (i.e., first tier), a second plurality of input/output signal contact fingers are shown as being evenly interspersed among a plurality of VDD I/O contact fingers on the first ledge area 122. In particular, the number of input/output signal contact fingers formed between adjacent VDD I/O contact fingers is shown to be generally 6 to 8 contact fingers. In addition, VSS CORE and VDD CORE contact fingers are also formed on the first ledge area 122. By thus forming all of the VSS I/O contact fingers on the second ledge area 124, and all of the VDD I/O contact fingers on the first ledge area 122, instead of mixing them between the two ledge areas, manufacturability of the integrated circuit package 100 is also enhanced.

Figure 12:
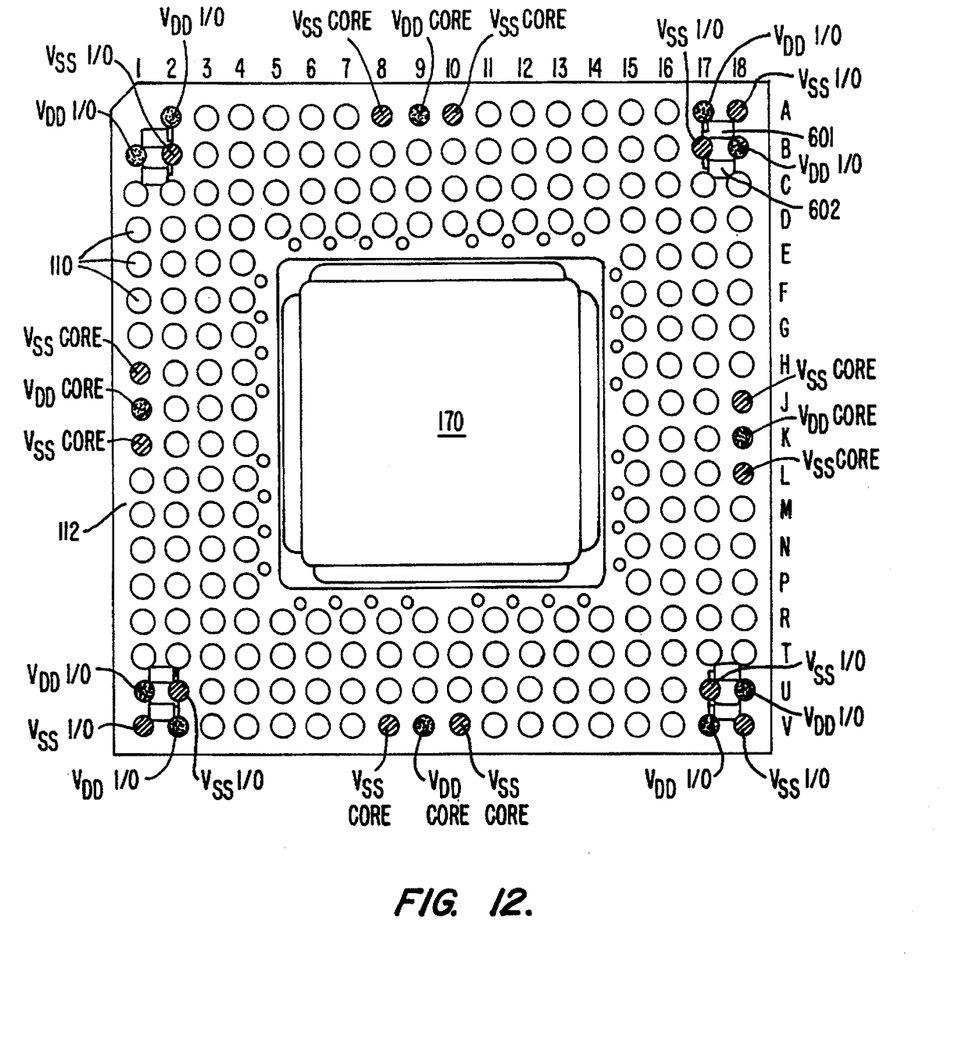
FIG. 12 illustrates, as an example, a bottom plan view, including a bottom surface and a plurality of pins of a PPGA package utilizing aspects of the present invention.
Figure 13:
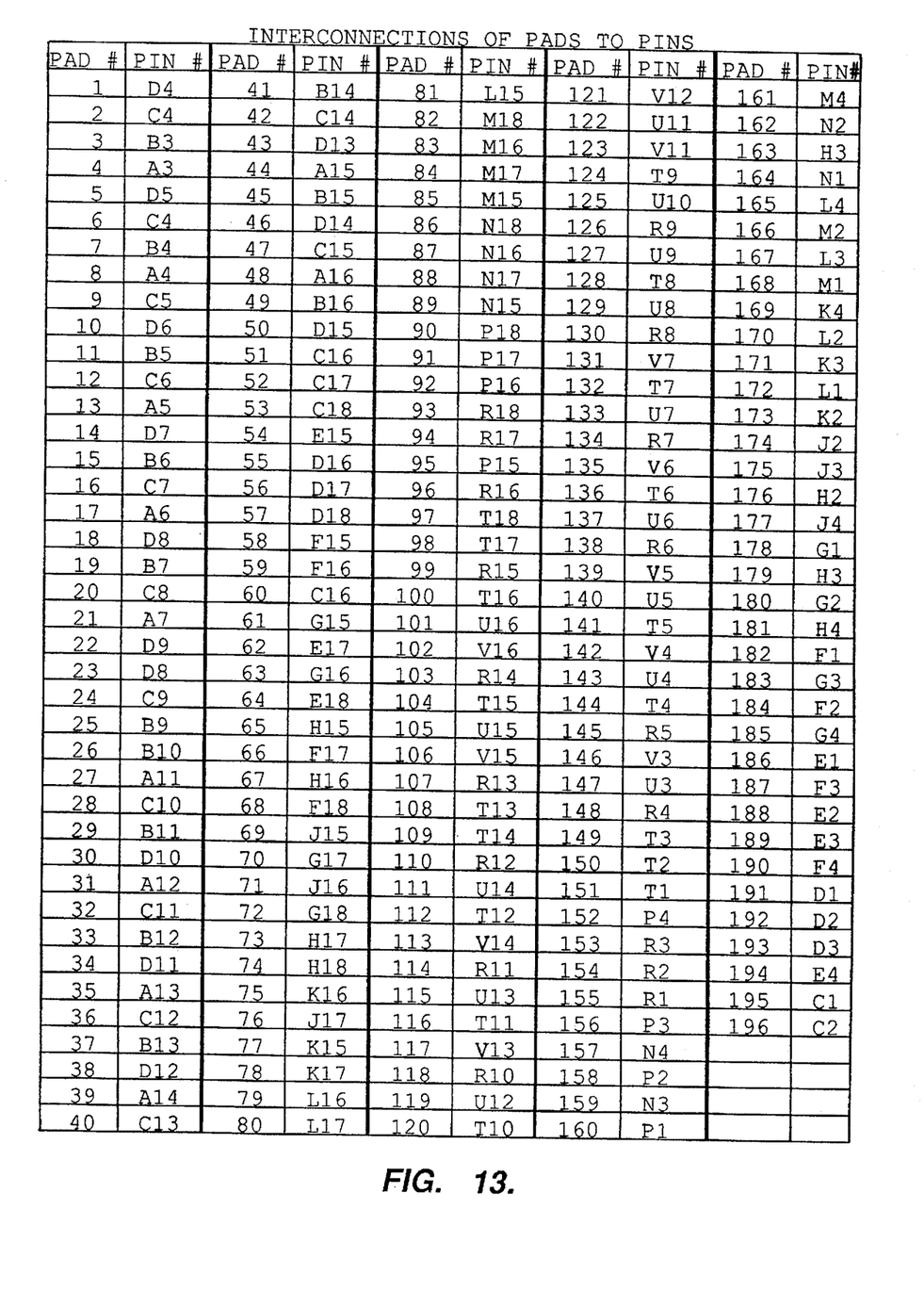
FIG. 13 illustrates, as an example, a table mapping the contact fingers identified in FIG. 9 to pins identified in FIG. 10.

FIG. 12 illustrates, as an example, a bottom plan view, including a bottom surface 112 and a plurality of pins 110 extending out of the bottom surface 112 of the PPGA package 100 utilizing aspects of the present invention, and FIG. 13 illustrates, as an example, a table mapping the input/output signal contact fingers identified in FIG. 11 by pad numbers (e.g., pad number 1), to their respective package pins as identified in FIG. 12 by pin numbers (e.g., pin number D4). Although not identified in the table of FIG. 13, the blackened VDD I/O and VSS I/O pins are shown in FIG. 12 to be placed in the four corners of the bottom surface 112 of the PPGA package 100, and the blackened VDD CORE and VSS CORE pins are shown in FIG. 12 to be placed in four areas, each area mid-way between adjacent corners of the bottom surface 112. For example, pins A17 and B18 are identified as VDD I/O pins, pins A18 and B17 are identified as VSS I/O pins, pins J18 and L18 are identified as VSS CORE pins, and pin K18 is identified as a VDD CORE pin.

By placing all of the VDD I/O and VSS I/O pins substantially equidistant from a center of the integrated circuit 104 housed beneath a ceramic bucket lid 170, the parasitic noise induced on these lines from the switching of active circuitry on the integrated circuit die 104 can be shown to be evenly distributed and as a consequence, "ground bounce" is reduced. Likewise, by also placing all of the VDD CORE and VSS CORE pins substantially equidistant from the center of the integrated circuit 104, the parasitic noise induced on these lines can also be shown to be evenly distributed with similar benefits.

Figure 4:
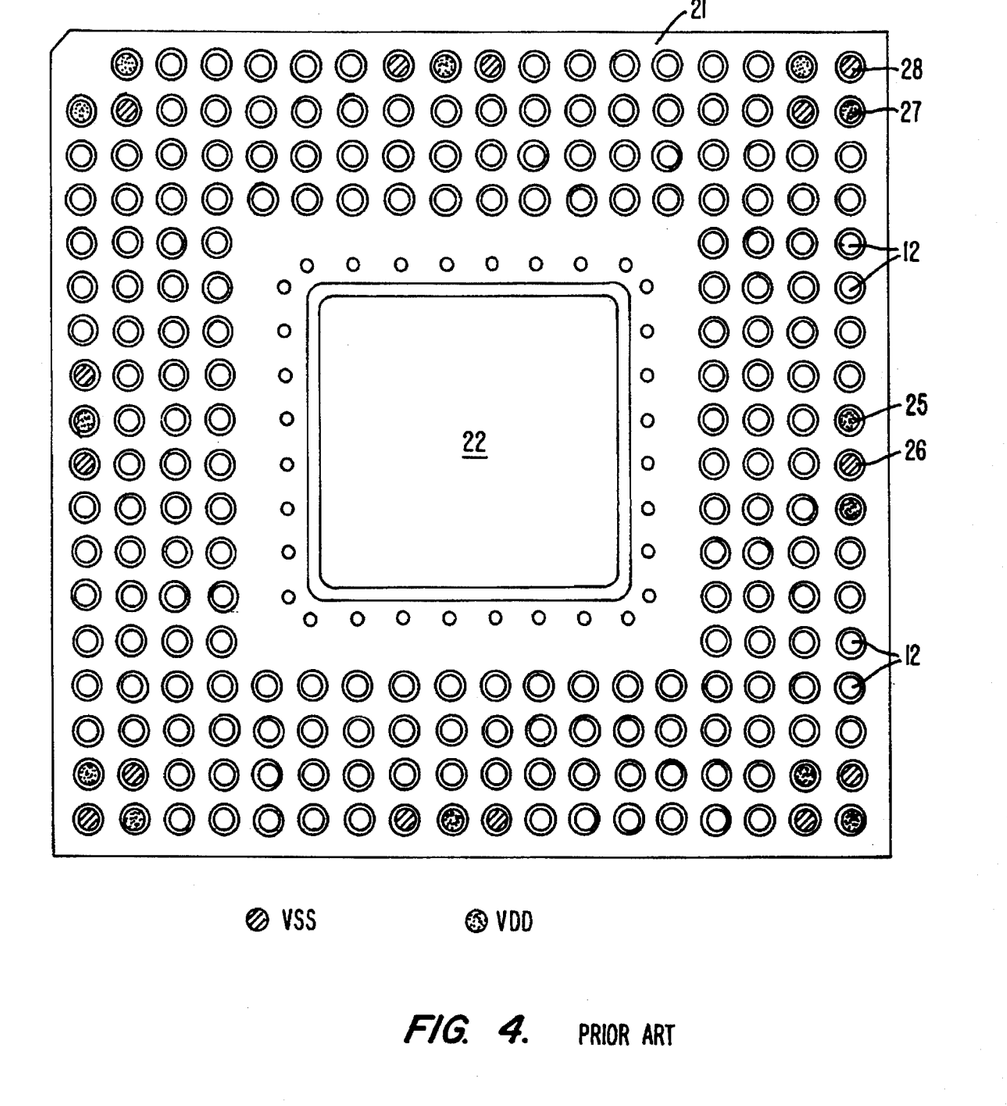

In contrast, associated VDD and VSS pins of prior art package structures are not placed in substantially equidistant locations from the centers of integrated circuits respectively encased in the package structures. Referring to FIG. 4, for example, VSS pins 28 and 26, which are connected together through a common VSS metallic layer (FIG. 2), are not a same distance from a center of the integrated circuit 13 housed under ceramic lid 22. VSS pin 28, which is formed in a corner of the bottom surface 21 of the package structure 10, is clearly further away from the center of the integrated circuit 13 than VSS pin 26, which is formed in an area mid-way between adjacent corners of the package structure 10.

Referring back to FIG. 12, two chip capacitor pads (e.g., 601 and 602), adjacent to the VDD I/O and VSS I/O pins in the upper right hand corner of the figure, are also shown. One of the pads (e.g., 601) is connected to the VDD I/O pins, and the other of the pads (e.g., 602) is connected to the VSS I/O pins in the upper right hand corner. By connecting a decoupling chip capacitor across the two chip capacitor pads (e.g., 601 and 602), the VDD I/O and VSS I/O lines can be effectively decoupled.

Although the various aspects of the present invention have been described with respect to a preferred embodiment, it will be understood that the invention is entitled to the full protection within the full scope of the appended claims.

What is claimed is:

1. A multi-layered package structure for encasing an integrated circuit die having first and second ground reference buses, first and second voltage supply buses, a plurality of transistors coupled together and to said first and second ground reference and said first and second voltage supply buses so as to define an integrated circuit having a plurality of input/output connections for communicating input/output signals, first and second pluralities of input/output bond pads coupled to corresponding ones of said plurality of input/output connections, a first plurality of ground bond pads coupled to said first ground reference bus, a second plurality of ground bond pads coupled to said second ground reference bus, a first plurality of voltage supply bond pads coupled to said first voltage supply bus, and a second plurality of voltage supply bond pads coupled to said second voltage supply bus, wherein said plurality of transistors include a plurality of core transistors coupled to said second plurality of ground bond pads and said second plurality of voltage supply bond pads, and a plurality of input/output transistors coupled to said first plurality of ground bond pads and said first plurality of voltage supply bond pads for controlling input/output signals to and from said plurality of core transistors, said package structure comprising:

a plurality of contact fingers including first and second pluralities of input/output contact fingers, first and second pluralities of ground contact fingers, and first and second pluralities of voltage supply contact fingers positioned such that individual ones of said first plurality of input/output contact fingers are coupled to corresponding ones of said first plurality of input/output bond pads, individual ones of said second plurality of input/output contact fingers are coupled to corresponding ones of said second plurality of input/output bond pads, individual ones of said first plurality of ground contact fingers are coupled to corresponding ones of said first plurality of ground bond pads, individual ones of said second plurality of ground contact fingers are coupled to corresponding ones of said second plurality of ground bond pads, individual ones of said first plurality of voltage supply contact fingers are coupled to corresponding ones of said first plurality of voltage supply bond pads, and individual ones of said second plurality of voltage supply contact fingers are coupled to corresponding ones of said second plurality of voltage supply bond pads of said integrated circuit die when said integrated circuit die is encased in said package structure;

a first signal metallization layer coupled to said first plurality of input/output contact fingers;

a second signal metallization layer coupled to said second plurality of input/output contact fingers;

a first ground metallization layer coupled to said first plurality of ground contact fingers, and interposed between said first and second signal metallization layers so as to inhibit cross-talk between said first and second signal metallization layers;

a first voltage supply metallization layer coupled to said first plurality of voltage supply contact fingers, wherein said first signal metallization layer is interposed between said first ground and said first voltage supply metallization layers;

a second voltage supply metallization layer coupled to said second plurality of voltage supply contact fingers, and interposed between said second signal and said first ground metallization layers; and a second ground metallization layer coupled to said second plurality of ground contact fingers, wherein said second signal metallization layer is interposed between said second voltage supply and said second ground metallization layers.

2. A multi-layered package structure comprising:

an integrated circuit die having first and second ground reference buses, first and second voltage supply buses, a plurality of transistors coupled together and to said first and second ground reference and said first and second voltage supply buses so as to define an integrated circuit having a plurality of input/output connections for communicating input/output signals, first and second pluralities of input/output bond pads coupled to corresponding ones of said plurality of input/output connections, a first plurality of ground bond pads coupled to said first ground reference bus, a second plurality of ground bond pads coupled to said second ground reference bus, a first plurality of voltage supply bond pads coupled to said first voltage supply bus, and a second plurality of voltage supply bond pads coupled to said second voltage supply bus, wherein said plurality of transistors include a plurality of core transistors coupled to said second plurality of ground bond pads and said second plurality of voltage supply bond pads, and a plurality of input/output transistors coupled to said first plurality of ground bond pads and said first plurality of voltage supply bond pads for controlling input/output signals to and from said plurality of core transistors:

a first signal metallization layer coupled to said first plurality of input/output bond pads;

a second signal metallization layer coupled to said second plurality of input/output bond pads;

a first ground metallization layer coupled to said first plurality of ground bond pads, and interposed between said first and second signal metallization layers so as to inhibit cross-talk between said first and second signal metallization layers;

a first voltage supply metallization layer coupled to said first plurality of voltage supply bond pads, wherein said first signal metallization layer is interposed between said first ground and said first voltage supply metallization layers;

a second voltage supply metallization layer coupled to said second plurality of voltage supply bond pads, and interposed between said second signal and said first ground metallization layers; and a second ground metallization layer coupled to said second plurality of ground bond pads, wherein said second signal metallization layer is interposed between said second voltage supply and said second ground metallization layers.

* * * * *